(12) United States Patent
Himori et al.

(10) Patent No.: US 9,245,776 B2
(45) Date of Patent: Jan. 26, 2016

(54) PLASMA PROCESSING APPARATUS

(75) Inventors: Shinji Himori, Nirasaki (JP); Daisuke Hayashi, Nirasaki (JP); Akitaka Shimizu, Nirasaki (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 677 days.

(21) Appl. No.: 12/979,875

(22) Filed: Dec. 28, 2010

(65) Prior Publication Data

US 2011/0155322 A1 Jun. 30, 2011

Related U.S. Application Data

(60) Provisional application No. 61/307,629, filed on Feb. 24, 2010.

(30) Foreign Application Priority Data

Dec. 28, 2009 (JP) .................................. 2009-297687

(51) Int. Cl.
*H01J 37/32* (2006.01)
*H01L 21/67* (2006.01)

(52) U.S. Cl.
CPC ....... *H01L 21/67069* (2013.01); *H01J 37/3255* (2013.01); *H01J 37/32091* (2013.01); *H01J 37/32541* (2013.01); *H01J 37/32577* (2013.01); *H01J 37/32605* (2013.01)

(58) Field of Classification Search
CPC C23C 14/34; C23C 16/4401; C23C 16/4412; C23C 16/452; C23C 16/455; C23C 16/45565; C23C 16/482; C23C 16/509; C23C 16/5096; C23C 16/511; C23C 16/517; H01J 2237/022; H01J 37/32008; H01J 37/32017; H01J 37/32035; H01J 37/32082; H01J 37/32091; H01J 37/321; H01J 37/32107; H01J 37/32116; H01J 37/32125; H01J 37/32187; H01J 37/32192; H01J 37/32196; H01J 37/32205; H01J 37/3244; H01J 37/32473; H01J 37/32491; H01J 37/32532–37/32614; H01J 37/3255; H01J 37/32623; H01J 37/32633; H01J 37/32669; H01J 37/32696; H01J 37/32714; H01L 21/67069

USPC ..... 118/715, 723 R, 723 MP, 723 E, 723 ER; 156/345.43, 345.44, 345.45, 346.46, 156/345.47, 345.33, 345.1; 204/155, 156, 204/192.32, 192.1, 192.38, 193, 298.37, 204/293.31, 298.16, 298.02, 298.01, 280; 216/63, 67; 257/E21.218; 422/186.29, 422/186.04, 906, 907, 186; 427/535, 534, 427/533, 532, 457, 570, 569, 906

See application file for complete search history.

(56) References Cited

U.S. PATENT DOCUMENTS 1,350,279 A * 8/1920 Howe ............................ 361/290
3,341,671 A * 9/1967 Anater et al. ............... 200/16 B (Continued)

FOREIGN PATENT DOCUMENTS

| CN | 1842243 A | 10/2006 |
|---|---|---|
| JP | 2-35438 U | 3/1990 |

(Continued)

*Primary Examiner* — Parviz Hassanzadeh
*Assistant Examiner* — Stanislav Antolin
(74) *Attorney, Agent, or Firm* — Rothwell, Figg, Ernst & Manbeck, P.C.

(57) ABSTRACT

A plasma processing apparatus includes a processing chamber in which a target substrate is processed; an application electrode and a facing electrode provided to face each other in the processing chamber, a plasma generation space being formed between the application electrode and the facing electrode; and an RF power supply connected to the application electrode, an RF power being supplied from the RF power supply to the application electrode. At least one of the application electrode and the facing electrode includes a base formed of a metal, and a dielectric body inserted into the base, one or more metal plate electrodes being buried in the dielectric body.

18 Claims, 9 Drawing Sheets

(56) References Cited

U.S. PATENT DOCUMENTS

| | | | |
|---|---|---|---|
| 5,006,192 A * | 4/1991 | Deguchi | 156/345.44 |
| 5,280,219 A * | 1/1994 | Ghanbari | 315/111.41 |
| 5,401,974 A * | 3/1995 | Oae et al. | 250/492.2 |
| 5,660,744 A * | 8/1997 | Sekine et al. | 219/121.43 |
| 5,716,486 A * | 2/1998 | Selwyn et al. | 156/345.28 |
| 5,748,434 A * | 5/1998 | Rossman et al. | 361/234 |
| 5,932,116 A * | 8/1999 | Matsumoto et al. | 219/121.57 |
| 6,074,488 A * | 6/2000 | Roderick et al. | 118/728 |
| 6,095,084 A * | 8/2000 | Shamouilian et al. | 118/723 E |
| 6,110,287 A * | 8/2000 | Arai et al. | 156/345.34 |
| 6,239,403 B1 * | 5/2001 | Dible et al. | 219/121.43 |
| 6,478,924 B1 * | 11/2002 | Shamouilian et al. | 156/345.48 |
| 2001/0003298 A1 * | 6/2001 | Shamouilian et al. | 156/345 |
| 2002/0005169 A1 * | 1/2002 | Daviet | 118/723.001 |
| 2002/0094591 A1 * | 7/2002 | Sill et al. | 438/14 |
| 2003/0052085 A1 * | 3/2003 | Parsons | 216/60 |
| 2003/0079983 A1 * | 5/2003 | Long et al. | 204/164 |
| 2003/0227258 A1 * | 12/2003 | Strang et al. | 315/111.21 |
| 2004/0118344 A1 * | 6/2004 | Ni et al. | 118/723 E |
| 2004/0218339 A1 * | 11/2004 | Nakamura | 361/234 |
| 2005/0061445 A1 * | 3/2005 | Koshiishi et al. | 156/345.47 |
| 2005/0098117 A1 * | 5/2005 | DiVergilio et al. | 118/723 E |
| 2005/0098742 A1 * | 5/2005 | Kellerman et al. | 250/492.21 |
| 2005/0211384 A1 * | 9/2005 | Hayashi | 156/345.47 |
| 2005/0276928 A1 * | 12/2005 | Okumura et al. | 427/446 |
| 2006/0065369 A1 * | 3/2006 | Dhindsa et al. | 156/345.44 |
| 2006/0219363 A1 * | 10/2006 | Matsumoto et al. | 156/345.47 |
| 2006/0273733 A1 * | 12/2006 | Honda et al. | 315/111.21 |
| 2007/0212567 A1 * | 9/2007 | Esaki et al. | 428/650 |
| 2007/0227665 A1 * | 10/2007 | Matsumoto et al. | 156/345.47 |
| 2008/0073032 A1 * | 3/2008 | Koshiishi et al. | 156/345.51 |
| 2008/0083710 A1 * | 4/2008 | Chen et al. | 219/121.48 |
| 2008/0310077 A1 * | 12/2008 | Itamura et al. | 361/306.3 |
| 2009/0101284 A1 * | 4/2009 | Higuma et al. | 156/345.51 |
| 2009/0242135 A1 * | 10/2009 | Koshimizu et al. | 156/345.48 |
| 2010/0224323 A1 | 9/2010 | Himori | |
| 2010/0224325 A1 | 9/2010 | Himori et al. | |
| 2014/0057454 A1 * | 2/2014 | Subramonium et al. | 438/763 |

FOREIGN PATENT DOCUMENTS

| | | |
|---|---|---|
| JP | H02 35438 U * | 3/1990 |
| JP | H0235438 U * | 9/1999 |
| WO | WO 2008120946 A1 * | 10/2008 |

* cited by examiner

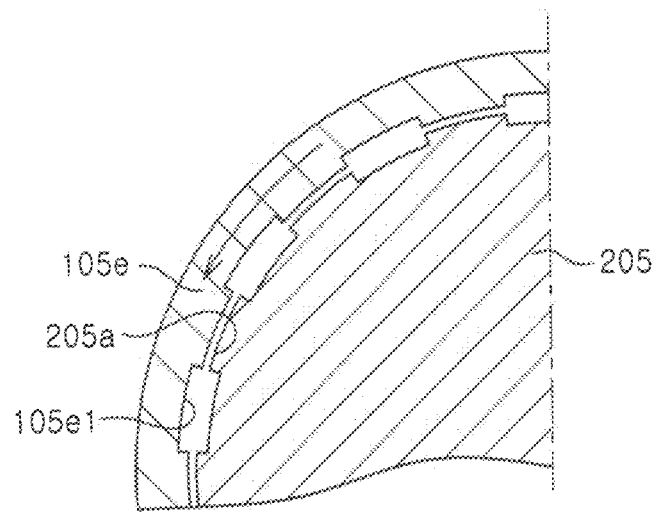
FIG.6B1
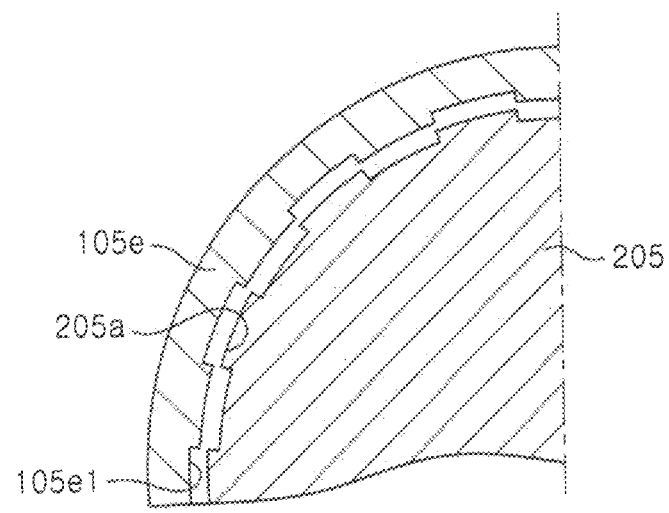
FIG.6B2

PLASMA PROCESSING APPARATUS

CROSS-REFERENCE TO RELATED APPLICATIONS

This application claims priority to Japanese Patent Application No. 2009-297687 filed on Dec. 28, 2009 and U.S. Provisional Application No. 61/307,629 filed on Feb. 24, 2010, the entire contents of which are incorporated herein by reference.

FIELD OF THE INVENTION

The present invention relates to a plasma processing apparatus in which a predetermined plasma process is performed through the action of a plasma; and, more particularly, to a plasma processing apparatus including an electrode structure for controlling the intensity distribution of an electric field caused by an RF power consumed to generate a plasma.

BACKGROUND OF THE INVENTION

A capacitive coupled (parallel plate) plasma processing apparatus, an inductively coupled plasma processing apparatus, a microwave plasma processing apparatus or the like has been put to practical use in an apparatus for performing a micro process such as an etching process or a film forming process on a target substrate to be processed by using a plasma. Especially, in the parallel plate plasma processing apparatus, a radio frequency (RF) power is supplied to at least one of an upper electrode and a lower electrode facing to each other, and a gas is excited by an energy of an electric field of the RF power to thereby generate a plasma. Then, the generated discharge plasma is used for performing such micro process on the target substrate.

In response to recent demands for the device scaling-down, it has been necessary to supply a power having a relatively high frequency and generate a high-density plasma. As shown in FIG. 9, if the frequency of a power supplied from a RF power supply 915 becomes increased, a current of the RF power is propagated through the surface of a lower electrode 910 and from an end portion of an upper surface of the lower electrode 910 toward a central portion thereof.

Accordingly, the intensity of the electric field gets higher at the central portion of the lower electrode 910 than that at the end portion thereof and, thus, the ionization and dissociation of the gas is more accelerated at the central portion of the lower electrode 910 than that at the end portion thereof. As a result, the electron density of the plasma gets higher at the central portion of the lower electrode 910 than that at the end portion thereof. Since the resistivity of the plasma is lowered at the central portion of the lower electrode 910 where the electron density of the plasma is higher than the end portion, the RF current is also concentrated at a central portion of an upper electrode 905 that faces the lower electrode 910, thereby making the plasma density further non-uniform.

For that reason, to improve the uniformity of the plasma, there has been suggested a method of installing a flat dielectric body 920a at the lower center of the upper electrode 905 as shown in FIG. 2C (see, e.g., Japanese Patent Application Publication No. 2004-363552). With such method, the electric field intensity distribution E/Emax under the dielectric body 920a may be lowered by the action of the dielectric body 920a.

Further, to improve the uniformity of the plasma further, there has been suggested a method of forming the dielectric body 920 in a taper shape as shown in FIG. 2B. With such method, since a capacitance component becomes larger at an end portion of the dielectric body 920 than that at a central portion thereof, the electric field intensity distribution E/Emax may not be excessively lowered at the end portion of the dielectric body 920 as compared with the case of the flat dielectric body 920a shown in FIG. 2C. Resultantly, it is possible to improve the uniformity of the electric field intensity distribution E/Emax more efficiently.

In the meantime, in the case of installing the taper-shaped dielectric body 920 in a base member (of the upper electrode 905), the dielectric body 920 is adhered to the base member by using an adhesive or screws. At this time, a linear thermal expansion difference may develop between the base member formed of, e.g., a metal such as aluminum or the like and the dielectric body 920 formed of, e.g., a ceramic or the like. Accordingly, it is necessary to provide an adequate gap therebetween.

However, in the case of the dielectric body 920 of the taper shape, the dimensional precision at the tapered portion may be deteriorated due to the machining work and, resultantly, the stress concentration occurs due to such thermal expansion difference. In addition, the stress concentration also occurs due to a thermal conductive difference caused by a deviation of dimensional tolerance of the adhesive interface and/or a difference of thickness of the dielectric body 920. Such stress concentration causes the adhesive on the adhesive interface to be peeled off and the peeled-off adhesive comes out of the gap, thereby polluting the inside of the chamber.

SUMMARY OF THE INVENTION

In view of the above, the present invention provides a plasma processing apparatus capable of controlling the intensity distribution of an electric field caused by an RF power consumed to generate a plasma.

In accordance with an aspect of the present invention, there is provided a plasma processing apparatus including a processing chamber in which a target substrate is processed; an application electrode and a facing electrode provided to face each other in the processing chamber, a plasma generation space being formed between the application electrode and the facing electrode; and an RF power supply connected to the application electrode, an RF power being supplied from the RF power supply to the application electrode. At least one of the application electrode and the facing electrode includes a base formed of a metal, and a dielectric body inserted into the base, one or more metal plate electrodes being buried in the dielectric body.

With the plasma processing apparatus, it is considered that the amount of currents flowing through the metal surfaces of the metal plate electrodes is approximately identical to that of a current flowing through the metal surface of the base. As a result, from the plasma side, the base and the respective plate electrodes are seen as if they are provided as a single unit. Accordingly, portions of the dielectric body located on the sides of the respective plate electrodes opposite to the plasma side are seen as if they were not provided. In other words, from the plasma side, it is seen that portions of the dielectric body on the rear sides of the plate electrodes are respectively interrupted by the plate electrodes. Accordingly, when all potentials of the plate electrodes are adjusted to the ground level, the capacitance component becomes larger at the end portion of the dielectric body than that at the central portion thereof. As a result, it is possible to obtain the uniform electric field intensity distribution at the end portions of the plate electrodes without significantly lowering the electric field intensity distribution E/Emax. In this way, it is possible to obtain the similar effect to the case of providing the taper-shaped dielectric body shown in FIG. 2B.

In accordance with another aspect of the present invention, there is provided an electrode used in a plasma processing apparatus which generates a plasma of a gas by an RF power supplied to the electrode and performs a plasma process on a target substrate by using the generated plasma. The electrode serves as one of an application electrode and a facing electrode that face each other and between which a plasma generation space is formed, and the electrode includes a base formed of a metal; and a dielectric body inserted into the base, a metal plate electrodes being buried in the dielectric body.

BRIEF DESCRIPTION OF THE DRAWINGS

The objects and features of the present invention will become apparent from the following description of embodiments, given in conjunction with the accompanying drawings, in which:

FIGS. 6A, 6B1 and 6B2 show another example of the driving method in accordance with the present embodiment;

DETAILED DESCRIPTION OF THE EMBODIMENTS

Figure 1:
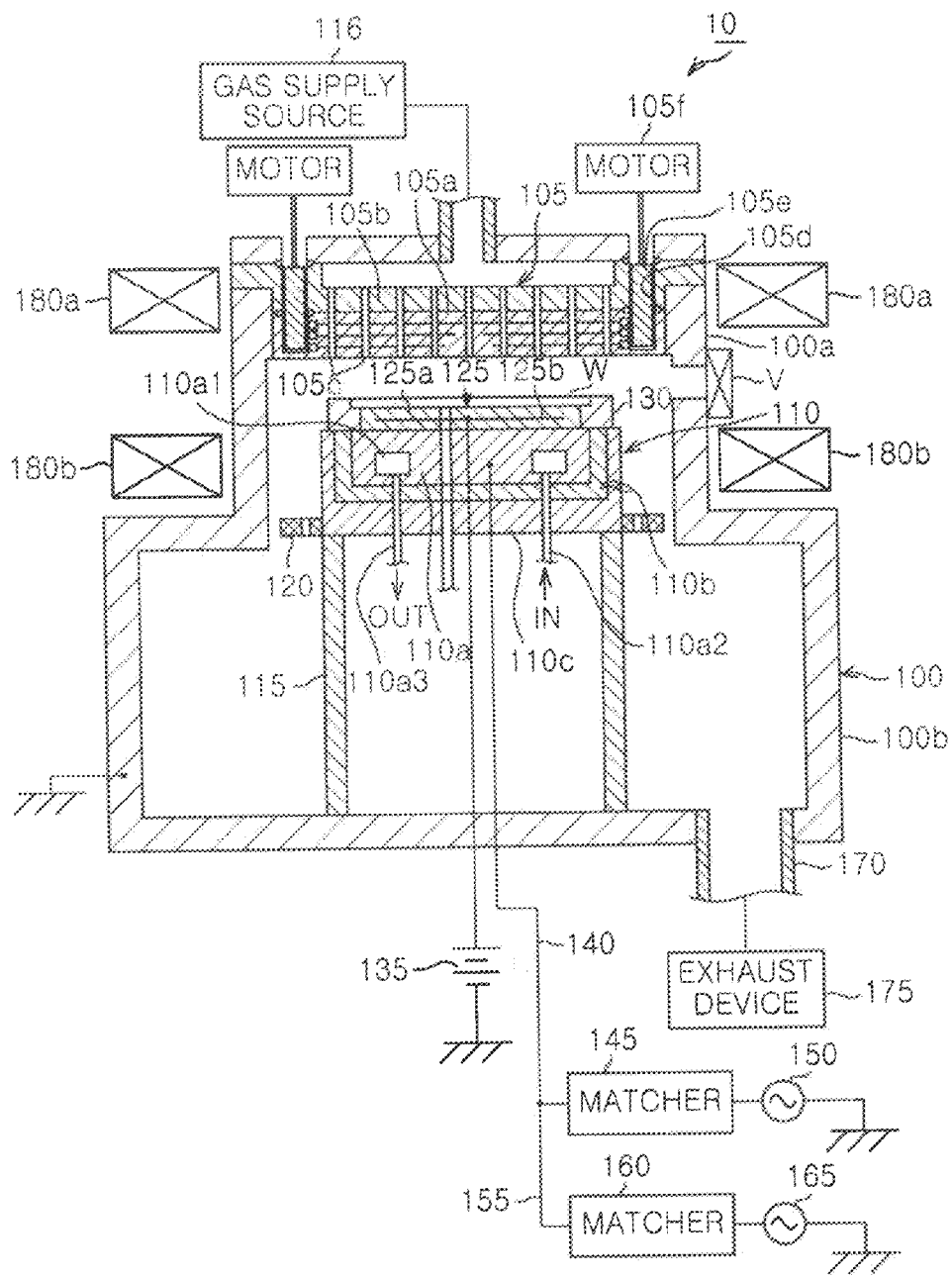
FIG. 1 is a longitudinal cross sectional view showing an RIE plasma etching apparatus in accordance with an embodiment of the present invention.

An embodiment of the present invention will now be described in detail with reference to the accompanying drawings which form a part hereof. Further, in the following description and drawings, components having substantially the same configuration and function are denoted by like reference characters, and thus redundant description thereof will be omitted herein.

(Configuration of Plasma Processing Apparatus)

First, the configuration of a plasma processing apparatus in accordance with an embodiment of the present invention will be described with reference to FIG. 1. FIG. 1 is a longitudinal cross sectional view showing an RIE plasma etching apparatus (parallel plate plasma processing apparatus) 10 in accordance with the embodiment of the present invention. The RIE plasma etching apparatus 10 is taken as an example of a plasma processing apparatus for performing a desired plasma process on a target substrate to be processed.

The RIE plasma etching apparatus 10 includes an evacuable processing chamber 100. The processing chamber 100 includes an upper chamber 100a having a relatively smaller diameter and a lower electrode having a relatively larger diameter 100b and is formed of, e.g., a metal such as aluminum or the like. The processing chamber 100 is grounded.

In the processing chamber 100, an upper electrode 105 and a lower electrode 110 are arranged to face each other, serving as a pair of parallel plate electrodes. A wafer W is loaded into the processing chamber 100 through a gate valve V to be mounted on the lower electrode 110. A processing gas is introduced into a plasma generation space between the upper electrode 105 and the lower electrode 110 and converted into a plasma by an RF power. The wafer W is etched by using the plasma.

The upper electrode 105 includes an upper base 105a and a gas diffusion portion 105b provided immediately above the upper base 105a, wherein the gas diffusion portion 105b is formed of a conductor, and the upper base 105a and the gas diffusion portion 105b serve together as a shower head. A plurality of gas introduction lines is extended through the upper base 105a. The gas is supplied through a gas supply source 116 and diffused in the gas diffusion portion 105b, and the diffused gas is introduced from a plurality of gas channels formed in the gas diffusion portion 105b and the gas introduction lines and a plurality of gas holes 105c of the upper base 105a into the processing chamber 100.

The upper electrode 105 further includes an upwardly opened annular groove portion 105d, and a ring electrode 105e is provided in the groove portion 105d. The ring electrode 105e is configured to be moved up and down by a rotating force of a motor 105f provided in an atmospheric space. A driving mechanism including the ring electrode 105e is insulated from other members by an adequately arranged insulation member (not shown). The configuration of the upper electrode 105 will be described in detail later.

The lower electrode 110 includes a lower base 110a formed of, e.g., a metal such as aluminum or the like and supported in a support unit 110c via an insulation layer 110b. Accordingly, the lower electrode 110 is electrically floated. A lower portion of the support unit 110c is covered by a cover 115. A baffle plate 120 is provided at a lower peripheral portion of the support unit 110c to control the flow of the processing gas.

A coolant path 110a1 is provided in the lower electrode 110 to circulate a coolant introduced through a coolant introducing line 110a2 and exhaust it through a coolant discharge line 110a3. In this way, the temperature of the lower electrode 110 is controlled to a desired level.

An electrostatic chuck mechanism is provided immediately above the lower electrode 110 and includes a metal sheet member 125b buried in an insulation member 125a. A DC power supply 135 is connected to the metal sheet member 125b, and the wafer W is electrostatically attracted to and held on the lower electrode 110 by supplying a DC voltage outputted from the DC power supply 135 to the metal sheet member 125b. A focus ring 130 formed of, e.g., silicon is provided at an outer peripheral portion of the electrostatic chuck mechanism 125 to maintain the uniformity of the plasma.

The lower electrode 110 is connected to a first matcher 145 and a first RF power supply 150 through a first power supply rod 140. The gas inside the processing chamber 100 is excited by an energy of an electric field of an RF power outputted from the first RF power supply 150, and a thus-generated discharge plasma is used to perform an etching process on the wafer W.

Further, the lower electrode 110 is also connected to a second matcher 160 and a second RF power supply 165 through a second power supply rod 155 branched from the first power supply rod 140. An RF power of, e.g., 3.2 MHz outputted from the second RF power supply 165 is used as a bias voltage to attract ions to the lower electrode 110.

A gas exhaust port 170 is provided at a bottom portion of the processing chamber 100, and the inside of the processing chamber 100 is maintained at a desired vacuum state by driving a gas exhaust device 175 connected to the gas exhaust port 170.

Multi-pole ring magnets 180a and 180b are arranged around the upper chamber 100a. Specifically, as for the multi-pole ring magnets 180a and 180b, a plurality of anisotropic segment columnar magnets are attached on an annular magnetic casing such that magnetic pole directions of the adjacent anisotropic segment columnar magnets are reversed from each other. Accordingly, magnetic force lines are formed between the adjacent segment magnets and, thus, a magnetic field is generated only at a peripheral portion of the plasma generation space between the upper electrode 105 and the lower electrode 110, to thereby confine the plasma in the plasma generation space.

Although the lower electrode 110 and the upper electrode 105 respectively serve as an application electrode and a facing electrode in the plasma processing apparatus of the present embodiment, the RF power may be supplied to the upper electrode 105 and the lower electrode 110, or the upper electrode 105 and the lower electrode 110 may respectively serve as the application electrode and the facing electrode.

(Configuration of Electrode)

Figure 2A:
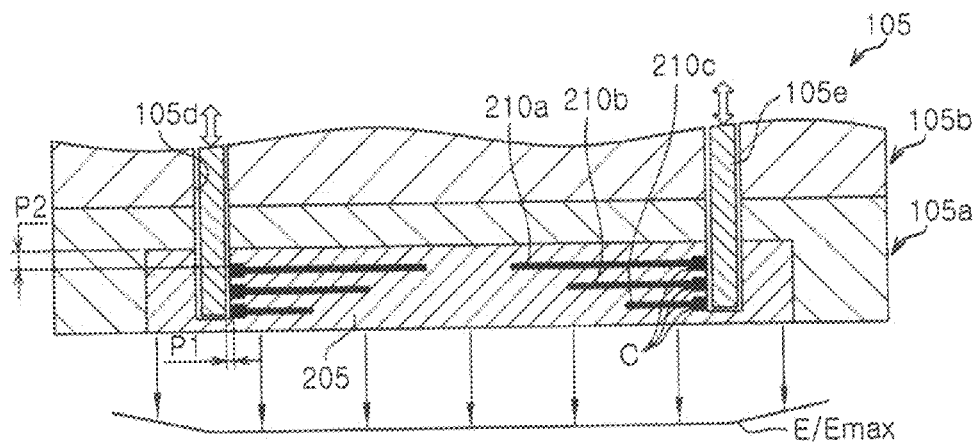
FIG. 2A is a longitudinal cross sectional view showing an upper electrode in accordance with the present embodiment.

Hereinafter, the configuration of the electrode in accordance with the present embodiment will be described in detail with reference to FIG. 2A. The upper electrode 105, as described above, includes the upper base 105a and the gas diffusion plate 105b. For example, the upper base 105a is formed of a plate-shaped metal.

The groove portion 105d is annularly formed in the upper base 105a. A cylindrical flat dielectric body 205 is inserted into a central portion of the upper base 105a. A lower surface of the dielectric body 205 is exposed to the plasma generation space. The dielectric body 205 is formed of a dielectric material such as quartz, ceramic or the like.

Three metal plate electrodes 210a to 210c are buried in the dielectric body 205. In the dielectric body 205, the plate electrodes 210a to 210c are arranged on top of one another with a gap therebetween. In the present embodiment, three plate electrodes are arranged, but the number of the plate electrodes is not limited thereto. One or two plate electrodes or four or more plate electrodes may be arranged.

The plate electrodes 210a to 210c are patterned. Specifically, the plate electrodes 210a to 210c respectively have different-sized openings that are concentric with regard to the center of the dielectric body 205. The opening of the plate electrode that is closer to a plasma generation space is formed to be larger than that of the plate electrode located further away from the plasma generation space. Accordingly, the plate electrodes 210a to 210c may have stepped portions in the central portion of the dielectric body 205.

The plate electrodes 210a to 210c may be formed of any metal, e.g., carbon, aluminum, tungsten or the like. The plate electrodes 210a to 210c are formed of the same metal. Further, each of the plate electrodes 210a to 210c has a connector C at its outer peripheral portion to be easily electrically coupled to the ring electrode 105e which will be described later. As for an example of the manufacturing method of burying the plate electrodes in the dielectric body, a method to insert and press the plate electrodes 210a to 210c formed of, e.g., carbon into the dielectric body 205 formed of, e.g., quartz can be considered.

(Driving Mechanism)

The ring electrode 105e provided in the groove portion 105d is vertically moved by the motor 105f shown in FIG. 1. Accordingly, it is possible to control an electric connection state between the ring electrode 105e and the respective plate electrodes 210a to 210c. The ring electrode 105e and the motor 105f serve as an example of a driving mechanism. Especially, the ring electrode 105e serves as an example of a driving unit. A rod-shaped electrode may be taken as another example of the driving unit.

The electric potentials between the ring electrode 105e and the respective plate electrodes 210a to 210c are controlled by adjusting the distances between the ring electrode 105e and the connectors C of the respective plate electrodes 210a to 210c by the vertical movement of the ring electrode 105e. For example, when the ring electrode 105e is moved downwardly close to the upper plate electrode 210a, the ring electrode 105e approaches the connector C of the plate electrode 210a and, thus, the plate electrode 210a becomes electrically connected to the ring electrode 105e. Although it is not shown, the potential of the ring electrode 105e is maintained to a ground level in the present embodiment. Accordingly, in the present embodiment, the expression "to be electrically connected" indicates the state where the potential of the plate electrode 210a approaches a ground level and a corresponding RF current flows through a surface skin of the plate electrode 210a.

In other words, when the distance between the ring electrode 105e and the connector C of the plate electrode 210a becomes smaller than a skin depth related to the RF power, the plate electrode 210a is electrically connected to the ring electrode 105e. The skin depth indicates the thickness of a surface skin of a conductor through which an RF current flows substantially. Accordingly, if the distance between the ring electrode 105e and the plate electrode 210a is smaller than the skin depth as in the present embodiment, the RF current flows through the surface of the plate electrode 210a. On the other hand, if the distance between the ring electrode 105e and the plate electrode 210a is larger than the skin depth, no RF current flows through the surface of the plate electrode 210a. Resultantly, the potential of the plate electrode 210a becomes a floating level that is slightly higher than the ground level. In this way, it is possible to control the potential of the plate electrode.

The skin depth is defined by the following equation:

$$\delta = (2/\omega\sigma\mu)^{1/2},$$

where $\omega = 2\pi f$ (f being a frequency), $\sigma$ is a conductivity, and $\mu$ is a permeability.

Then, if the ring electrode 105e is moved further downwardly close to the intermediate plate electrode 210b, the ring electrode 105e approaches the connector C of the plate electrode 210b and, thus, the plate electrodes 210a and 210b become electrically connected to the ring electrode 105e. Accordingly, in this state, the potentials of the plate electrodes 210a and 210b are adjusted to the ground level.

Thereafter, if the ring electrode 105e is moved still further downwardly close to the lower plate electrode 210c, the ring electrode 105e approaches the connector C of the plate electrode 210c and, thus, all the plate electrodes 210a to 210c become electrically connected to the ring electrode 105e. Accordingly, in this state, all the potentials of the plate electrodes 210a to 210c are adjusted to the ground level.

In this way, to control respective potentials of the plate electrodes 210a to 210c, a distance P1 between an end portion of the connector C and the ring electrode 105e is made to be sufficiently smaller than a distance P2 between the upper plate electrode 210a of the plate electrodes 210a to 210c and an upper surface of the dielectric body 205. Accordingly, it is possible to control the potentials of the respective plate electrodes 210a to 210c to the ground potential level or the floating level with high precision while preventing the case where the plate electrode 210a is electrically connected to the metal of the upper base 105a on the dielectric body 205.

In other words, in the present embodiment, by adjusting the distance P2 to be sufficiently larger than the distance P1, an impedance Z2 generated at a portion (corresponding to the distance P2) between the plate electrode 210a and the upper base 105a is controlled to be sufficiently larger than an impedance Z1 generated at a portion (corresponding to the distance P1) between the ring electrode 105e and the respective connectors C. In this state, by adjusting the distance P1 between the ring electrode 105e and the respective connectors C, it is possible to control the potentials of the respective plate electrodes 210a to 210c to the ground level or the floating levels.

In the present embodiment, it is designed to easily couple the connector C of the plate electrode to the plate electrode by making a coupled part of the connector C to be thicker than that of the plate electrode. Further, by using a dielectric material having a high dielectric constant between the ring electrode 105e and the respective connectors C, it is possible to more easily perform the coupling therebetween and, furthermore, to improve the precision in controlling the potentials of the respective plate electrodes.

(Relationships Between Plate Electrode and Intensity Distribution of Electric Field)

Next, relationships between the potential control of the plate electrodes and the intensity distribution of electric field will be described. In case that a flat dielectric body 920a is buried at the central portion of an upper electrode 905 as shown in FIG. 2C, the electric field intensity distribution E/Emax is lowered at the central portion of the upper electrode 905. This is because, when the RF current flows through the metal surface of the upper electrode 905, a voltage thus generated is divided due to a capacitance component based on the volume of the dielectric body 920a provided at the central portion of the upper electrode 905 and another capacitance component of the sheath area provided around the lower surface of the upper electrode 905 and, thus, the dispersion in the intensity of the RF electric field is generated below the dielectric body 905.

Figure 2B:
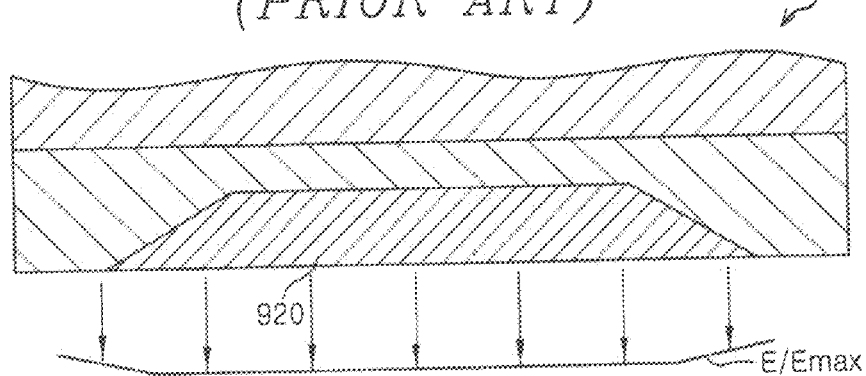
FIGS. 2B and 2C are longitudinal cross sectional views respectively showing conventional upper electrodes.
Figure 2C:
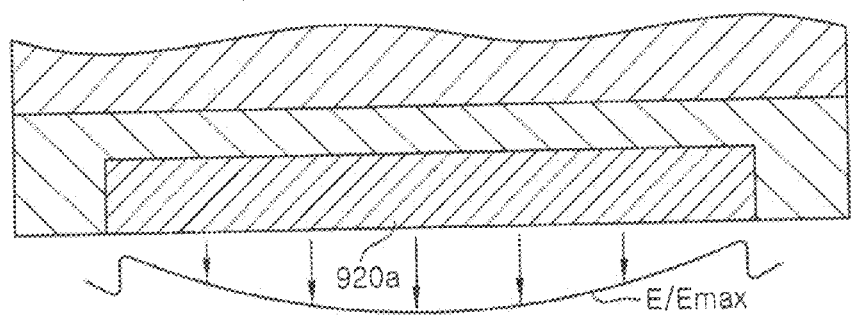

If the dielectric body 920 having the taper shape is provided as shown in FIG. 2B to improve the intensity distribution of the electric field, the uniformity of the electric field intensity distribution E/Emax is increased from the end portion of the upper electrode 905 toward the central portion thereof. This is because the capacitance component becomes larger at the end portion of the dielectric body 920 than that at the central portion thereof and, thus, the uniform electric field intensity distribution is obtained without significantly lowering the electric field intensity distribution E/Emax as compared with the case of providing the flat electric body 920a.

However, in the case of the dielectric body 920 having the taper shape, the dimensional precision at the tapered portion may be deteriorated due to machining work and, resultantly, the stress concentration occurs due to a thermal expansion difference, which causes the adhesive on the adhesive interface to be peeled off, thereby polluting the inside of the chamber.

Accordingly, in the present embodiment, the electric field intensity distribution E/Emax is improved by burying the plate electrodes 210a to 210c in the dielectric body 205.

Figure 3A:
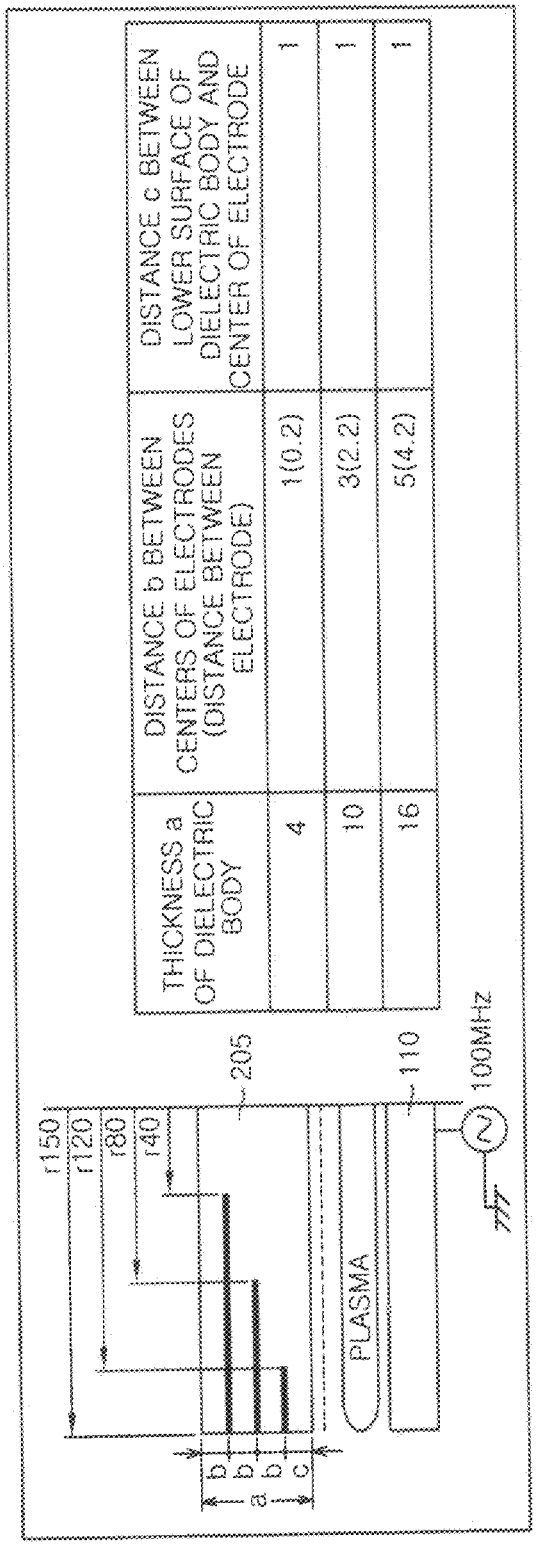
FIGS. 3A and 3B show simulation results of the intensity distribution of an electric field when a plurality of plate electrodes is installed in the upper electrode in accordance with the present embodiment.

Hereinafter, the configuration of the plate electrodes and their operation and effect will be described based on the simulation results shown in FIGS. 3A and 3B.

As simulation conditions, the distances r between the center of the dielectric body 205 and the respective plate electrodes 210a to 210c (the radii of the openings of the respective plate electrodes 210a to 210c) were set to about 40, 80 and 120 mm. The dielectric body 205 has the radius of about 150 mm and is formed of quartz.

The thickness "a" of the dielectric body 205 was varied to about 4, 10 and 16 mm. For example, when the thickness "a" of the dielectric body 205 was set to about 4 mm, the distance "b" between the centers of the adjacent plate electrodes (and the distance "b" between the upper surface of the dielectric body 205 and the center of the upper plate electrode 210a) and the distance "c" between the lower surface of the dielectric body 205 and the center of the lower plate electrode 210c were set to about 1 mm. Since the thickness of the plate electrode was set to about 0.8 mm, the distance between the adjacent plate electrodes became about 0.2 mm.

When the thickness "a" of the dielectric body 205 was set to about 10 mm, the distance "b" between the centers of the adjacent plate electrodes (and the distance "b" between the upper surface of the dielectric body 205 and the center of the upper plate electrode 210a) was set to about 3 mm, and the distance "c" between the lower surface of the dielectric body 205 and the center of the lower plate electrode 210c was set to about 1 mm. Since the thickness of the plate electrode was set to about 0.8 mm, the distance between the adjacent plate electrodes became about 2.2 mm.

When the thickness "a" of the dielectric body 205 was set to about 16 mm, the distance "b" between the centers of the adjacent plate electrodes (and the distance "b" between the upper surface of the dielectric body 205 and the center of the upper plate electrode 210a) was set to about 5 mm, and the distance "c" between the lower surface of the dielectric body 205 and the center of the lower plate electrode 210c was set to about 1 mm. The distance between the adjacent plate electrodes became about 4.2 mm.

The sheet resistivity of each of the plate electrodes 210a to 210c is required to be set low, e.g., to about $2\Omega/\square$ or less in order to allow the amount of currents flowing through the metal surfaces of the plate electrodes 210a to 210c to be approximately identical to that of a current flowing through the metal surface of the upper base 105a by setting the potentials of the outer and the inner peripheral portion of the plate electrodes 210a to 210c to be approximately identical to each other. As a result, from the plasma side, the upper base 105a and the respective plate electrodes 210a to 210c are seen as if they were provided as a single unit. Accordingly, portions of the dielectric body 205 located on the sides of the respective plate electrodes 210a to 210c opposite to the plasma side are seen as if they were not provided. In other words, from the plasma side, was seen that portions of the dielectric body 205 on the rear sides of the respective plate electrodes 210a to 210c are respectively interrupted by the plate electrodes 210a to 210c.

Accordingly, by varying the diameters of the openings of the respective plate electrodes 210a to 210c and arranging the respective plate electrodes 210a to 210c such that the stepped portions could be seen from the plasma side, the capacitance component at the end portion of the dielectric body 205 is changed to have three stepped portions from the central portion thereof when all potentials of the plate electrodes 210a to 210c are adjusted to the ground level.

Figure 3B:
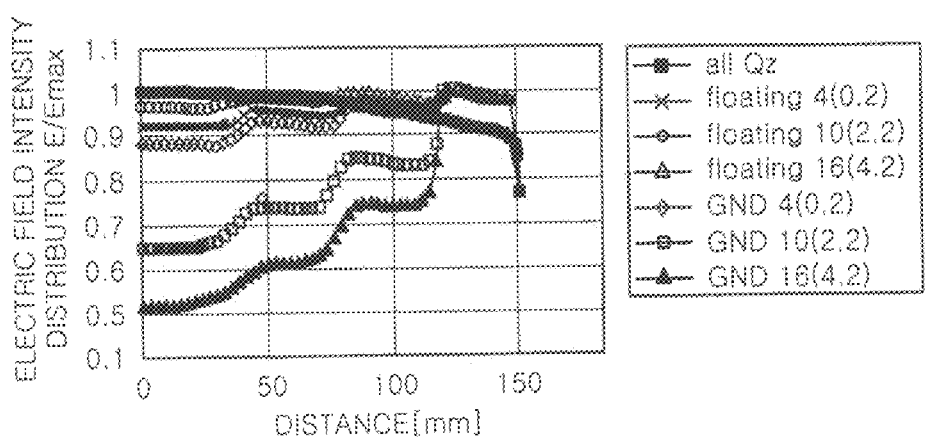

Resultantly, as shown by curves GND4(0.2) (indicating the case that all potentials of the plate electrodes 210a to 210c were set to the ground level, the thickness of the dielectric body 205 was set to about 4 mm and the distance therebetween was set to about 0.2 mm), GND10(2.2) and GND16 (4.2) in FIG. 3B, it was possible to obtain the uniform electric field intensity distribution without significantly lowering the electric field intensity distribution E/Emax as compared with the case of providing the flat electric body 920a shown in FIG. 2c. Accordingly, in accordance with the present embodiment, it is possible to obtain the similar effect to the case of providing the taper-shaped dielectric body 920 shown in FIG. 2B.

From the curves GND4(0.2), GND10(2.2) and GND16 (4.2) obtained by setting all potentials of the plate electrodes 210a to 210c approximately to the ground level, it is seen that, as the thickness of the dielectric body 205 becomes thicker, the effect of lowering the electric field intensity distribution E/Emax becomes increased.

It is also seen that, from the curves floating4(0.2), floating10(2.2) and floating16(4.2) in case that all potentials of the plate electrodes 210a to 210c were set to the floating levels, the effect of lowering the electric field intensity distribution E/Emax becomes decreased as compared with the case that all potentials of the plate electrodes 210a to 210c were set to the ground level.

However, it is seen that, in the cases that all potentials of the plate electrodes 210a to 210c were set to the ground level or the floating levels, the effect of lowering the electric field intensity distribution E/Emax is achieved as compared with the case (all QZ) that no plate electrode is buried in the dielectric body.

In the present embodiment, when the RF current flows through the metal surface of the upper base 105a of the upper electrode 105, a dispersion is generated in the RF energy due to the capacitance based on the dielectric body 205 inserted into the upper base 105a. Accordingly, the intensity distribution of the RF electric field may be lowered on the surface of the dielectric body 205 as compared with that on the surface of the upper base 105a.

In addition, in the present embodiment, the plate electrodes 210a to 210c are buried in the dielectric body 205. In case that potentials of the plate electrodes 210a to 210c are controlled such that the RF current flows through not only the metal surface of the dielectric body 205 but also the surface skins of the plate electrodes 210a to 210c, portions of the dielectric body 205, located on the side of the respective plate electrodes 210a to 210c opposite to the plasma seen as if they were not provided. Accordingly, it is possible to make the intensity distribution of the RF electric field uniform.

Further, in the present embodiment, although the upper electrode 105 is eroded by the plasma, it is possible to prevent the plate electrodes 210a to 210c from being damaged since the plate electrodes 210a to 210c are not exposed to the plasma. Besides, by burying the plate electrodes 210a to 210c in the dielectric body 205, it is possible to realize the structure in which the plate electrodes 210a to 210c have the stepped portions.

In the meantime, it is sufficient to use one plate electrode. However, if a plurality of plate electrodes is arranged as in the present embodiment, it is possible to cope with the case even when the electric field intensity distribution is changed as the process conditions are varied. In other words, the potentials of the respective plate electrodes are adjusted to the ground level or the floating levels by adequately operating the driving mechanism depending on the process condition.

For example, when the electric field intensity at the central portion of the upper electrode 105 is very high, the three plate electrodes 210a to 210c are connected to the ground potential. On the other hand, when the electric field intensity at the central portion of the upper electrode 105 is not very high, only the upper plate electrode 210a is connected to the ground level. In this way, it is possible to vary the electrostatic capacitance by varying the amount overlapped between the plate electrodes by controlling the states of the potentials of the respective plate electrodes. Accordingly, even when the process conditions are varied, it is possible to make the intensity distribution of the RF electric field uniform.

(Detailed Driving Method)

Next, the method of connecting the ring electrode 105e to the plate electrodes 210a to 210c will be conceptually described with reference to FIGS. 4A and 4B, and some examples of the detailed driving method of the ring electrode 105e will be described based on FIGS. 5 to 6B.

The ring electrode 105e and the plate electrodes 210a to 210c may be connected to each other by a contact method or a non-contact method. For example, the contact method includes a connector connection method shown in FIG. 4A and a contact connection method shown in FIG. 4B. In accordance with the contact connection method shown in FIG. 4B, the physical connection between the ring electrode 105e and the respective plate electrodes 210a to 210c is controlled by allowing portions Q of the respective plate electrodes 210a to 210c to be in direct contact with or to be out of contact with the ring electrode 105e depending on the vertical position of the ring electrode 105e, without using the connectors C respectively provided at the end portions of the plate electrodes 210a to 210c as shown in FIG. 4A. In this way, the states of the potentials of the respective plate electrodes 210a to 210c are controlled.

Figure 4A:
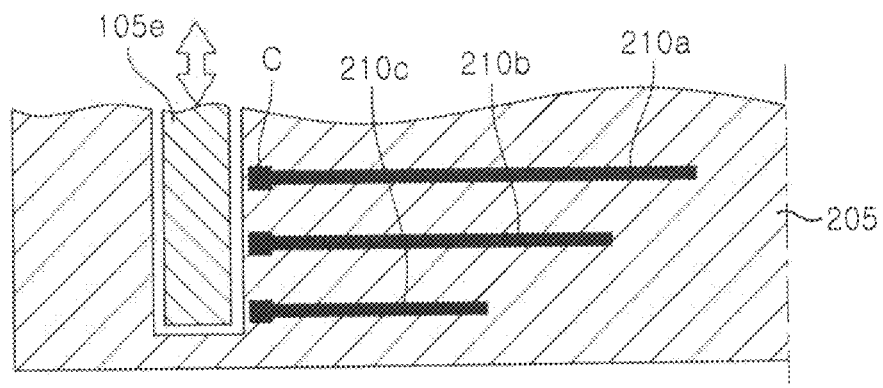
FIGS. 4A and 4B conceptually show a connecting method of a driving mechanism in accordance with the present embodiment.
Figure 4B:
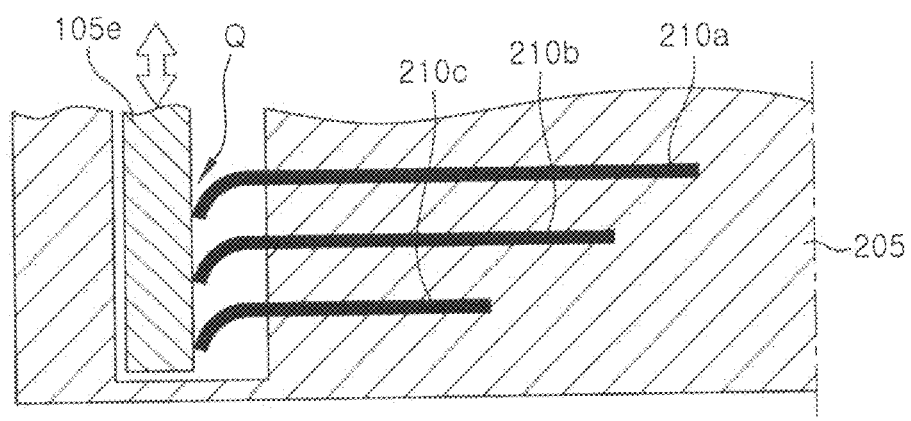

The detailed driving method of the ring electrode 105e includes a first method of vertically moving the ring electrode 105e without rotating the ring electrode 105e; a second method of rotating and vertically moving the ring electrode 105e; and a third method of rotating the ring electrode 105e without vertically moving the ring electrode 105e, all of them being usable in the connector connection method shown in FIG. 4A and the contact connection method shown in FIG. 4B.

For example, in case that the first method of vertical movement control is used in the connector contact method shown in FIG. 4A and the contact connection method shown in FIG. 4B, a linearly moving guide mechanism having at least three equivalent stages is installed as the ring electrode 105e and vertically moved by transferring a driving force thereto. As for a driving force generating source, a motor (e.g., a servo stepping motor) converting a rotating force to a linearly moving force, an actuator driven by compressed air, an electromagnetic solenoid actuator or the like may be used. Further, the driving force generating source may be driven by a magnetic force or an electric force.

In the case of using the motor converting a rotating force to a linearly moving force or the electromagnetic solenoid actuator, by controlling the movement of the ring electrode 105e to three positions, it is possible to control the ring electrode 105e to be connected to all the plate electrodes 210a to 210c, to the two plate electrodes 210a and 210b and to only the plate electrode 210a. As described above, the ring electrode 105e is not rotated in the first method.

Figure 5:
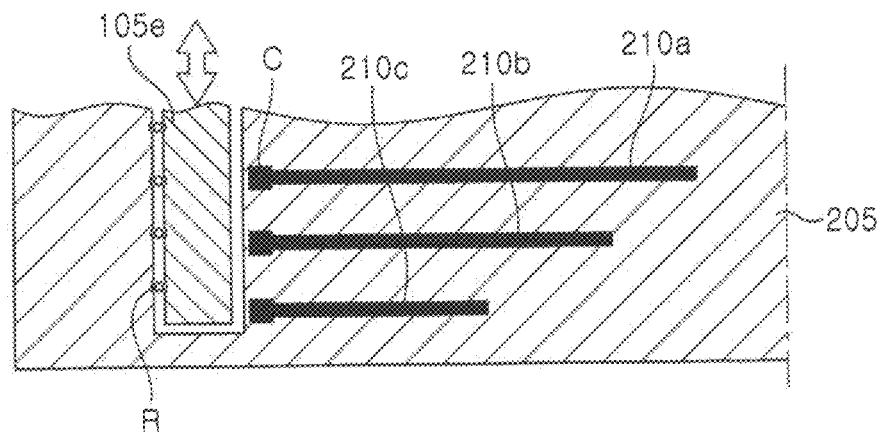
FIG. 5 shows an example of a driving method in accordance with the present embodiment.

In the second method of rotational and vertical movement control shown in FIG. 5, screw-shaped spiral grooves are formed at an outer (or inner) peripheral surface of the ring electrode 105 and a rotating force of the motor (e.g., a servo stepping motor) is transferred to the ring electrode 105e via a ball screw mechanism R, to thereby rotationally and vertically moving the ring electrode 105e. In this way, it is possible to control the position of the ring electrode 105e to allow the ring electrode 105e to be connected to all the respective plate electrodes 210a to 210c, the two plate electrodes 210a and 210b and to only the plate electrode 210a.

Figure 6A:
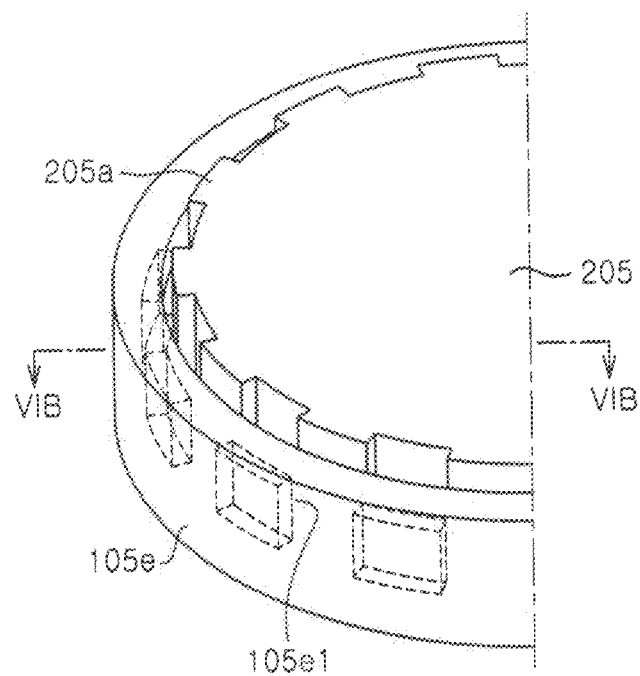

In the third method of rotation control, as shown in FIGS. 6A and 6B, recessed portions 105e1 are circumferentially provided in an inner wall surface of the ring electrode 105e, and protrusions 205a are formed in a tooth shape at an outer wall surface of the dielectric body 205. FIG. 6A is a perspective view showing the ring electrode 105e and the dielectric body 205 with the upper base 105a removed, and FIG. 6B shows the change in the relative position between the recessed portions 105e1 of the ring electrode 105e and the protrusions 205a of the dielectric body 205 in the cross-sectional view taken along VIB-VIB line shown in FIG. 6A.

Specifically, in the inner wall surface of the ring electrode 105e, the recessed portions 105e1 are arranged at a regular interval. Further, the protrusions 205a of the dielectric body 205 are arranged at the same interval as that of the depressed portions 105e1. An electric connection mode and a disconnection mode between the ring electrode 105e and the plate electrodes 210a to 210c may be switched to each other as the ring electrode 105e is rotated by transferring a rotating force of the motor (e.g., a servo stepping motor) to the ring electrode 105e.

In the connection mode, as shown in FIG. 6B1, the ring electrode 105e is rotated such that the recessed portions 105e1 and the protrusions 205a are not opposite to each other and the protrusions 205a are opposite to the inner wall of the ring electrode 105e. Accordingly, in the connection mode, the ring electrode 105e is electrically connected to the plate electrodes 210a to 210c and, thus, the potentials of the plate electrodes 210a to 210c are adjusted to the ground level.

In the disconnection mode, as shown in FIG. 6B2, the ring electrode 105 is rotated such that the recessed portions 105e1 and the protrusions 205a are opposite to each other. Accordingly, in the disconnection mode, the ring electrode 105e is electrically disconnected from the plate electrodes 210a to 210c and, thus, the potentials of the plate electrodes 210a to 210c are adjusted to the floating levels.

Especially, the third method of rotation control is adequate for the connector connection method. In the third method, it is possible to perform the connection that may not be performed by the first method and the second method, e.g., the connections of the ring electrode 105e with the two plate electrodes 210a and 210c and with the two plate electrodes 210b and 210c without the limitation to the all connection of the ring electrode 105e with all the plate electrodes 210a to 210c, the connection with the two plate electrodes 210a and 210b and the connection with only the plate electrode 210a. However, as for the connection points, the regular interval connection may be performed, but the entire circumference connection may not be performed.

As described above, in the third method, the ring electrode 105e is not vertically moved. Further, the ring electrode 105e and the dielectric body 205 may have any shapes capable of being electrically connected to and disconnected from each other without the limitation to the aforementioned tooth shape.

Further, although the ring electrode is vertically moved and/or rotated in the first method to the third method, and the dielectric body containing the plate electrode may be vertically moved and/or rotated while the ring electrode may be fixed.

Although the embodiment of the present invention has been described in detail with reference to the accompanying drawings, the present invention is not limited to the embodiment. It will be understood by those skilled in the art that various changes and modifications may be made without departing from the scope of the invention as defined in the following claims.

Figure 7:
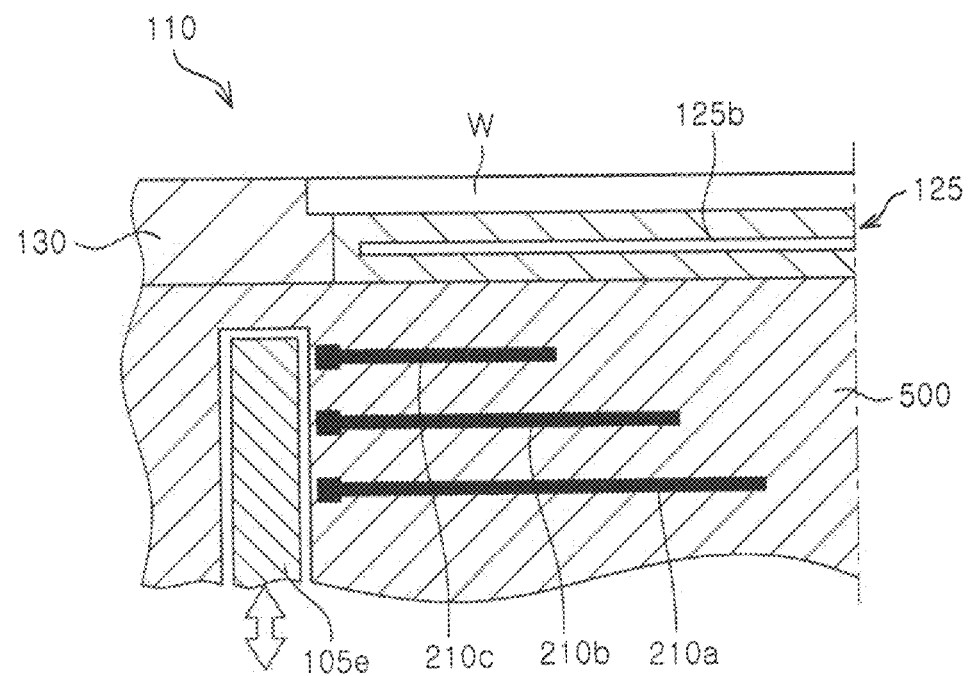
FIG. 7 is a longitudinal cross sectional view showing a lower electrode in which a plurality of plate electrodes is installed in accordance with the present embodiment.

For example, even though the upper electrode is taken as an example in the aforementioned embodiment, the plate electrodes may be provided in the lower electrode in the present invention. FIG. 7 shows the structure where the plate electrodes 210a to 210c are buried in the lower electrode 110. In this case, the plate electrodes 210a to 210c are buried in a dielectric body 500, below the metal sheet member 125b provided in the electrostatic chuck mechanism 125.

Figure 8:
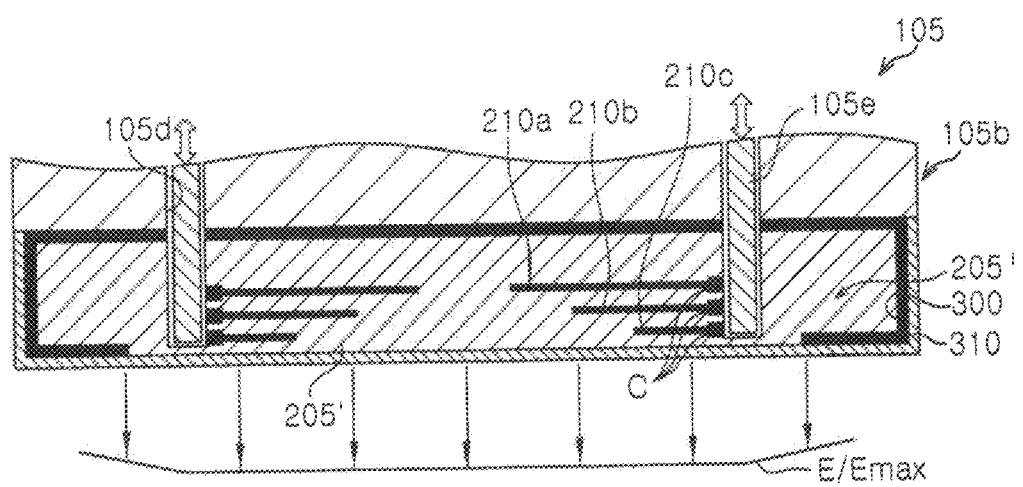
FIG. 8 is a longitudinal cross sectional view showing an upper electrode in accordance with a modification of the present embodiment.
Figure 9:
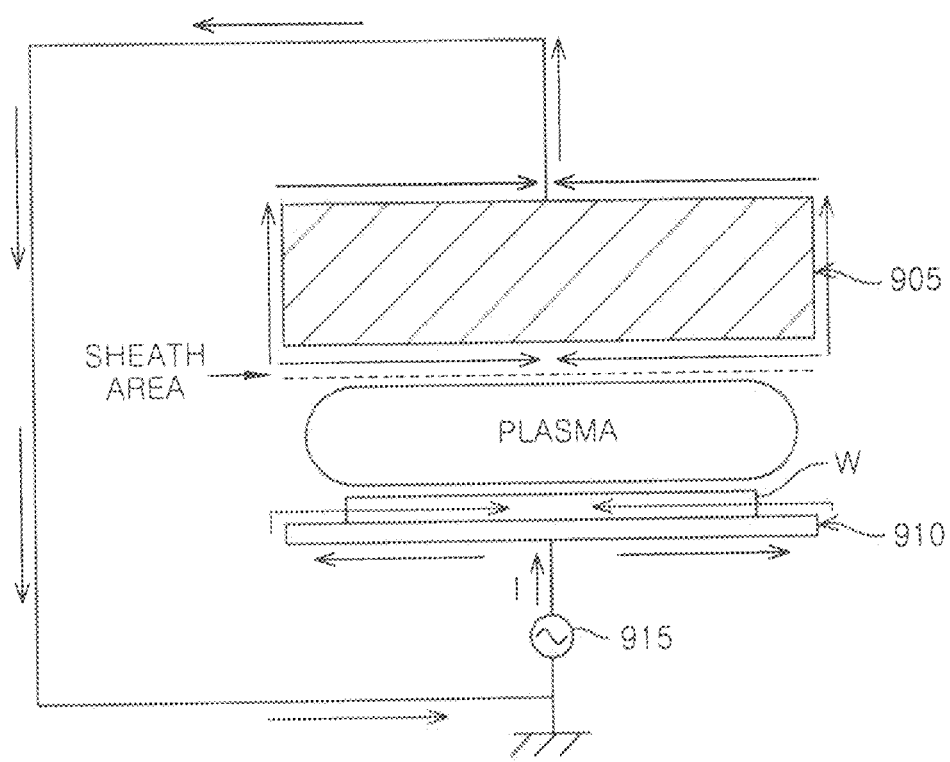
FIG. 9 is a view for explaining a current of an RF power supplied to a typical plasma apparatus.

Alternatively, the upper electrode of the present invention may have the configuration shown in FIG. 8. In an upper electrode shown in FIG. 8, the substantially entire surface of a dielectric base body 205' except for a lower central portion thereof is covered by a conductive cover 300. The conductive cover 300 is formed of, e.g., a metal such as aluminum, carbon, titanium, tungsten or the like. The conductive cover 300 is formed to have a thickness of several tens of micrometers by adhering it to the dielectric base body 205' by one of thermal spraying, adhesion of tape or sheet-shaped member, ion plating, and plating.

In this case, when an RF current flows through a metal surface of the conductive cover 300, a dispersion is generated in the RF energy due to the capacitance caused by the portion of the dielectric base body 205' that is not covered by the conductive cover 300. Accordingly, in case of the dielectric base body 205', it is possible to lower the intensity distribution of the RF electric field at the opening of the conductive cover 300 as compared with the case of a metal base body. In addition, the plate electrodes 210a to 210c are buried in the dielectric base body 205'. Accordingly, from the plasma side, it is seen that portions of the dielectric body 205' at the rear sides of the plate electrodes 210a to 210c are respectively interrupted by the plate electrodes 210a to 210c. Therefore, when all potentials of the plate electrodes 210a to 210c are adjusted to the ground level, the capacitance component becomes larger at the end portion of the dielectric body 205 than that at the central portion thereof. As a result, it is possible to obtain the uniform electric field intensity distribution at the end portions of the plate electrodes 210a to 210c without significantly lowering the electric field intensity distribution E/Emax.

Further, a thermally sprayed surface layer 310 may be formed by thermally spraying yttrium oxide having high plasma resistance to the whole surface of the upper base 105a (FC coating). It is preferable that the thickness of the thermally sprayed surface layer 310 becomes about 100 to 200 μm.

Besides, it is possible to reuse the electrode by peeling off the thermally sprayed surface layer 310 and thermally spraying it again.

The plasma processing apparatus of the present invention may be used in an inductively coupled plasma (ICP) processing apparatus or the like without being limited to the parallel plate type plasma processing apparatus in the above embodiment. Further, the present invention is applicable to an etching apparatus, a CVD processing apparatus, and a plasma processing apparatus for a solar battery.

Finally, although the RF power is supplied to the lower electrode, for example, in the above embodiment, the RF power may be supplied to one or both of the upper electrode and the lower electrode in the plasma processing apparatus of the present invention.

As described above, in accordance with the present embodiment, it is possible to control the intensity distribution of an electric field caused by an RF power consumed to generate a plasma.

What is claimed is:

1. A plasma processing apparatus comprising:
a processing chamber in which a target substrate is processed;
an application electrode;
a facing electrode positioned to face the application electrode in the processing chamber, a plasma generation space being formed between the application electrode and the facing electrode;
an RF power supply connected to the application electrode, an RF power being supplied from the RF power supply to the application electrode; and
wherein at least one of the application electrode and the facing electrode includes a base formed of a metal, a dielectric body inserted into the base, and a plurality of metal plate electrodes buried in the dielectric body,
wherein each of the metal plate electrodes are arranged on top of one another while being spaced from each other in the dielectric body,
wherein each of the metal plate electrodes have different-sized concentric openings with regard to a central portion of the dielectric body,
wherein a size of the concentric openings decreases in accordance with a distance of a respective metal plate electrode from the plasma generation space such that a concentric opening of a first metal plate electrode from the plurality of metal plate electrodes that is closer to the plasma generation space is larger than an opening of a second metal plate electrode from the plurality of metal plate electrodes located further away from the plasma generation space than the first metal plate electrode, and
wherein electric field intensity distribution of the RF power is controlled by controlling potentials of each of the metal plate electrodes.

2. The apparatus of claim 1, wherein each of the metal plate electrodes are formed of a same metal.

3. The apparatus of claim 1, wherein each of the metal plate electrodes have a sheet resistivity of about 2Ω/□ or less.

4. The apparatus of claim 1, wherein at least a part of a surface of the dielectric body is exposed to the plasma generation space.

5. The apparatus of claim 1, wherein a surface of the dielectric body facing the plasma generation space is coated with a thermally sprayed layer.

6. The apparatus of claim 1, further comprising:
a plurality of gas introduction lines,
wherein an upper one of the application electrode and the facing electrode includes the dielectric body in which each of the metal plate electrodes are buried, and the gas introduction lines are extended through the upper electrode.

7. The apparatus of claim 6, wherein a gas diffusion portion is provided above the dielectric body of the upper electrode, the gas diffusion portion communicating with the gas introduction lines and serving to diffuse a gas.

8. The apparatus of claim 1, wherein a lower one of the application electrode and the facing electrode includes an electrostatic chuck mechanism in which a metal sheet member is provided, and the dielectric body in which each of the metal plate electrodes are buried, wherein each of the metal plate electrodes are located below the metal sheet member of the electrostatic chuck.

9. The apparatus of claim 1, wherein the dielectric body has a cylindrical shape.

10. The apparatus of claim 1, further comprising: a driving mechanism including a driving unit having a ground potential,
wherein the driving mechanism is configured to control a physical or electric connection between the driving unit and each of the metal plate electrodes by moving the driving unit to change a position of the driving unit relative to each of the metal plate electrodes such that the potentials of each of the metal plate electrodes are selectively controlled to the ground potential, and
wherein when the potentials are controlled to the ground potential, a capacitance component at a peripheral portion of the dielectric body becomes larger than that at a central portion of the dielectric body, thereby obtaining a uniform electric field intensity distribution without significantly lowering an electric field intensity at the peripheral portion of the dielectric body.

11. The apparatus of claim 10, wherein the driving unit includes a ring electrode, and the driving mechanism controls a physical or electric connection between the ring electrode and each of the metal plate electrodes by driving the ring electrode.

12. The apparatus of claim 10, wherein the driving mechanism controls the physical or electric connection between the driving unit and each of the metal plate electrodes by one of: (a) vertically moving the driving unit without rotating the driving unit, (b) rotationally and vertically moving the driving unit, or (c) rotating the driving unit without vertically moving the driving unit.

13. The apparatus of claim 12, wherein the driving unit is further configured to vertically move the driving unit without rotating the driving unit to control the physical or electric connection between the driving unit and each of the metal plate electrodes.

14. The apparatus of claim 12, wherein the driving unit is further configured to rotationally and vertically move the driving unit to control the physical or electric connection between the driving unit and each of the metal plate electrodes.

15. The apparatus of claim 12, wherein the driving unit is further configured to rotate the driving unit without vertically moving the driving unit to control the physical or electric connection between the driving unit and each of the metal plate electrodes.

16. The apparatus of claim 10, wherein said at least one of the application electrode and the facing electrode further includes a groove portion opened toward an opposite side of the plasma generation space, and wherein the driving mechanism is further configured to drive the driving unit in the groove portion.

17. An electrode for use in a plasma processing apparatus which generates a plasma of a gas by an RF power supplied to the electrode and performs a plasma process on a target substrate by using the generated plasma, and the electrode serves as one of an application electrode and a facing electrode that face each other and between which a plasma generation space is formed, the electrode comprising:
a base formed of a metal; and
a dielectric body inserted into the base; and
a plurality of metal plate electrodes being buried in the dielectric body, and
wherein each of the metal plate electrodes are arranged on top of one another while being spaced from each other in the dielectric body,
wherein each of the metal plate electrodes respectively have different-sized openings that are concentric with regard to a central portion of the dielectric body, wherein a size of the concentric openings decreases in accordance with a distance of a respective metal plate electrode from the plasma generation space such that a concentric opening of a first metal plate electrode from the plurality of metal plate electrodes that is closer to the plasma generation space is larger than an opening of a second metal plate electrode from the plurality of metal plate electrodes located further away from the plasma generation space than the first metal plate electrode, and wherein electric field intensity distribution of the RF power is controlled by controlling potentials of each of the metal plate electrodes.

18. The electrode of claim 17, wherein each of the metal plate electrodes is configured to make a physical or electric connection with a driving unit having a ground potential by moving the driving unit to change a position of the driving unit relative to each of the metal plate electrodes such that the potentials of each of the metal plate electrodes are selectively controlled to the ground potential, and wherein when the potentials are controlled to the ground potential, a capacitance component at a peripheral portion of the dielectric body becomes larger than that at a central portion of the dielectric body, thereby obtaining a uniform electric field intensity distribution without significantly lowering an electric field intensity at the peripheral portion of the dielectric body.

* * * * *